(12) United States Patent
Park et al.

(10) Patent No.: US 7,804,572 B2
(45) Date of Patent: Sep. 28, 2010

(54) LIQUID CRYSTAL DISPLAY DEVICE AND FABRICATION METHOD THEREOF

(75) Inventors: Soo-Jeong Park, Seoul (KR); Young-Joo Kim, Goyang (KR); Seok-Woo Lee, Anyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/457,381

(22) Filed: Jun. 9, 2009

(65) Prior Publication Data

US 2009/0251630 A1 Oct. 8, 2009

Related U.S. Application Data

(62) Division of application No. 11/645,626, filed on Dec. 27, 2006, now Pat. No. 7,551,259.

(30) Foreign Application Priority Data

Jun. 30, 2006 (KR) .................. 10-2006-0061668

(51) Int. Cl.
G02F 1/1343 (2006.01)

(52) U.S. Cl. .................. 349/140; 349/38; 349/143

(58) Field of Classification Search .............. 349/140, 349/143, 38
See application file for complete search history.

(56) References Cited

U.S. PATENT DOCUMENTS 6,400,426 B1 6/2002 Yamazaki et al.

*Primary Examiner*—Jerry T Rahll
(74) *Attorney, Agent, or Firm*—Morgan Lewis & Bockius LLP

(57) ABSTRACT

A method for fabricating a liquid crystal display (LCD) device includes providing a first substrate including a pixel portion and a circuit portion, the circuit portion having first and second regions; forming an active pattern and a first gate insulation film at the pixel portion and the circuit portion and forming a storage electrode on a portion of the active pattern of the pixel portion; forming a second gate insulation film on the first substrate; forming a gate electrode at the first region and forming p+ source and drain regions at portions of the active pattern of the first region; forming a gate electrode at the pixel portion and the second region, and forming a common line at the pixel portion; forming n+ source and drain regions at the pixel portion and at a portion of the active pattern of the second region; and joining the first and second substrates.

13 Claims, 19 Drawing Sheets

LIQUID CRYSTAL DISPLAY DEVICE AND FABRICATION METHOD THEREOF

This is a divisional of U.S. patent application Ser. No. 11/645,626, filed Dec. 27, 2006, now U.S. Pat. No. 7,551,259, which is hereby incorporated by reference. This application also claims the benefit of Korean Patent Application No. 61668/2006 filed in Korea on Jun. 30, 2006, which is hereby incorporated by reference.

BACKGROUND OF THE INVENTION

1. Field of the Invention

The present invention relates to a liquid crystal display (LCD) device and its fabrication method and, more particularly, to an LCD capable having a simplified fabrication process, improved production yield and improved luminance.

2. Description of the Related Art

In the recent information society, a display device as a significant visual information transfer medium has become increasing important, and to take predominance in the market, the display device must meet requirements such as low power consumption, thin profile, light weight and high picture quality. A liquid crystal display (LCD), a major product of a flat panel display (FED), satisfies these conditions and is suitable for mass production as well. As a result, various types of new products of LCDs have been introduced and are replacing the existing cathode ray tubes (CRTs).

In general, the LCD devices display a desired image by controlling light transmittance of liquid crystal cells by separately supplying a data signal according to image information to the liquid crystal cells arranged in a matrix form. An active matrix (AM) method, a driving method typically used for the LCD device, is a method in which liquid crystals of a pixel portion are driven using an amorphous silicon thin film transistor (a-Si TFT) as a switching device. However, the electrical mobility of the amorphous silicon TFT cannot support a peripheral circuit requiring a high speed of 1 MHz or higher. Thus, research is actively being pursued to integrate both the pixel portion and the driving circuit portion on a glass substrate using polycrystalline silicon having a greater field effect mobility than with amorphous silicon. The polycrystalline silicon TFT technique is advantageous in that a driving circuit can be directly fabricated on the glass substrate due to the low photosensitivity and the high yield effect mobility of polycrystalline silicon.

The increase in mobility can enhance an operation frequency of the driving circuit that limits the number of driving pixels, and thus, the image resolution (minuteness or fineness) of the display device can be increased. In addition, because the time for charging a signal voltage of the pixel portion is reduced, distortion of a transmission signal is reduced, and thus, picture quality can be improved.

The structure of an LCD device will now be described with reference to FIG. 1. FIG. 1 is a schematic plan view showing the structure of a related art LCD device, specifically, a driving circuit-integrated LCD device in which a driving circuit portion is integrated on an array substrate.

As shown, the LCD device comprises a color filter substrate 5, an array substrate 10 and a liquid crystal layer (not shown) formed between the color filter substrate 5 and the array substrate 10. The array substrate 10 includes a pixel portion 35, an image display region in which unit pixels are arranged in a matrix form, and a driving circuit portion 30 having a data driving circuit unit 31 and a gate driving circuit unit 32 positioned at the periphery of the pixel portion 35. Though not shown, the pixel portion 35 has a plurality of gate lines and data lines arranged vertically and horizontally to define a plurality of pixel regions on the substrate 10, a TFT as a switching device formed at each crossing of the gate lines and the data lines, and a pixel electrode formed at the pixel region.

The driving circuit portion 30 of the array substrate 10 is protruded as compared with the color substrate 5 and positioned at an outer edge of the pixel portion 35 of the array substrate 10. In this case, the data driving circuit unit 31 is positioned at the longer side of the protruded array substrate 10 and the gate driving circuit unit 32 is positioned at the shorter side of the protruded array substrate 10.

To suitably output an input signal, the data driving circuit unit 31 and the gate driving circuit unit 32 use a TFT of a CMOS (Complementary Metal Oxide Semiconductor) structure, namely, an inverter. A CMOS is an integrated circuit having a MOS structure used for the driving circuit portion TFT which requires a high speed signal processing. The CMOS needs an n-channel TFT and a p-channel TFT, and has speed and density characteristics between an NMOS and a PMOS. The gate driving circuit unit 32 and the data driving circuit unit 31 supply a scan signal and a data signal to the pixel electrode through the gate lines and the data lines. Connected with an external signal input terminal (not shown), the gate driving circuit unit 32 and the data driving circuit unit 31 control an external signal input through the external signal input terminal and output it to the pixel electrode.

A color filter (not shown) for implementing color and a common electrode (not shown), a counter electrode of the pixel electrode formed on the array substrate 10, are formed on the pixel portion 35 of the color filter substrate 5. A cell gap is provided between the color filter substrate 5 and the array substrate 10 to uniformly separate the substrates 5 and 10 using spacers (not shown). The two substrates 5 and 10 are attached by a seal pattern (not shown) formed at an outer edge of the pixel portion 35, thereby forming a liquid crystal display panel. At this time, the attachment of the two substrates 5 and 10 is made by an attachment key formed at the color filter substrate 5 or the array substrate 10.

Since the above described driving circuit integrated LCD device uses a polycrystalline silicon TFT, it has excellent image quality and consumes less power. However, the driving circuit-integrated LCD device is disadvantageous because the n-channel TFT and the p-channel TFT are formed together on the same substrate. Thus, its fabrication process is quite complicated as compared with the amorphous silicon TFT LCD device in which only a single type channel is formed. In addition, a plurality of photolithography processes must be performed to fabricate the array substrate, including the TFTs. The photolithography processes are processes for forming a desired pattern by transferring a pattern drawn on a mask onto the substrate with thin film deposited thereon. The processes included coating a photosensitive solution, exposing photoresist and then developing the photoresist. As a result of the number of delicate steps, production yield is degraded. In particular, the mask designed for forming the pattern is high-priced, so the fabrication cost of the LCD device increases proportionally with the number of masks applied.

SUMMARY OF THE INVENTION

Accordingly, the present invention is directed to a liquid crystal display device and fabrication method thereof that substantially obviates one or more of the problems due to limitations and disadvantages of the related art.

An object of the present invention is to provide a liquid crystal display (LCD) device for which the number of masks used to fabricate thin film transistors is reduced.

Another object of the present invention is to provide an LCD having a larger aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method for fabricating a liquid crystal display (LCD) device comprises providing a first substrate including a pixel portion and a circuit portion, the circuit portion having first and second regions; forming an active pattern and a first gate insulation film at the pixel portion and the circuit portion and forming a storage electrode on a portion of the active pattern of the pixel portion; forming a second gate insulation film on the first substrate; forming a gate electrode at the first region and forming p+ source and drain regions at portions of the active pattern of the first region; forming a gate electrode at the pixel portion and the second region, and forming a common line at the pixel portion; forming n+ source and drain regions at the pixel portion and at a portion of the active pattern of the second region; and joining the first and second substrates.

In another aspect, a liquid crystal display device (LCD) comprises a first substrate including a pixel portion and a circuit portion, the circuit portion having first and second regions; a pixel portion active pattern formed at the pixel portion, first and second active patterns formed respectively at the first and second regions; a first gate insulation film formed on the pixel portion active pattern and the first and second active patterns; a storage electrode formed on a portion of the pixel portion active pattern; a second gate insulation film formed on the first substrate; a pixel portion gate electrode formed at the pixel portion and first and second gate electrodes formed respectively at the first and second regions; a pixel portion source electrode electrically connected to the pixel portion active pattern, and first and second source electrodes electrically connected to the first and second active patterns, respectively; a pixel portion drain electrode electrically connected to the pixel portion active pattern, and first and second drain electrodes electrically connected to the first and second active patterns, respectively; and a second substrate attached to the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

The liquid crystal display (LCD) device and its fabrication method according to the present invention will now be described with reference to the accompanying drawings.

Figure 1:
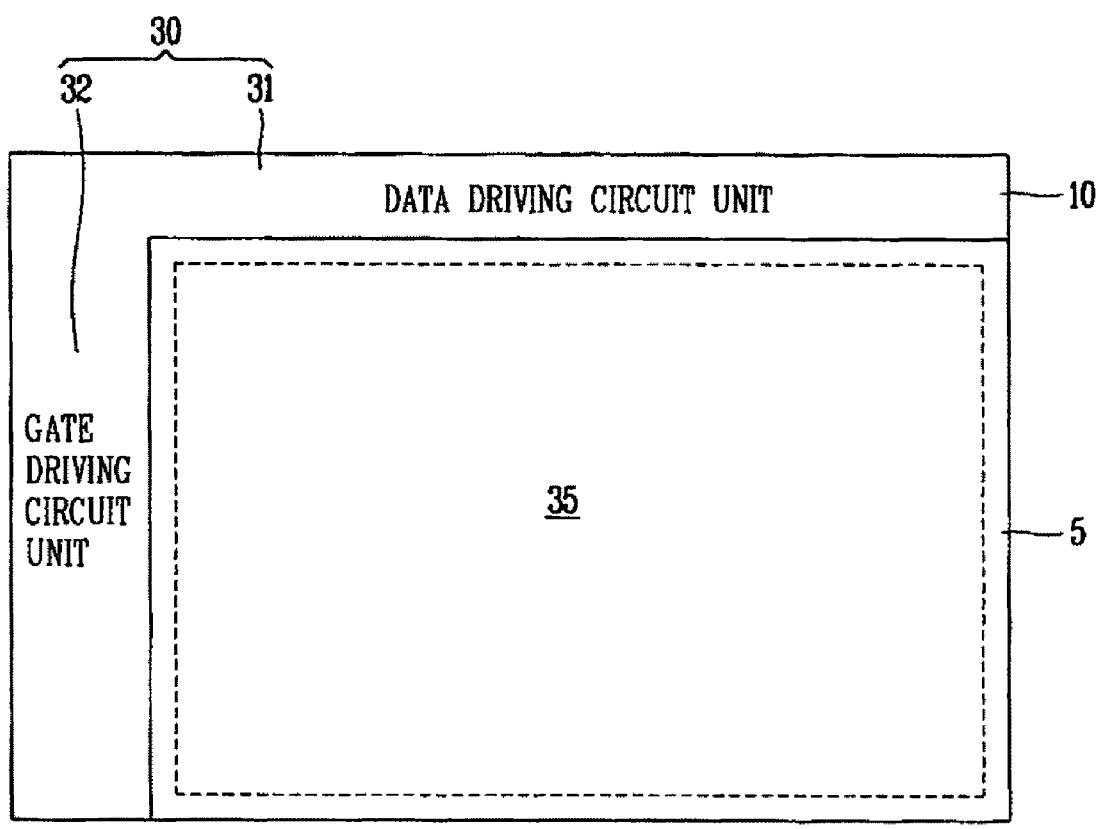
FIG. 1 is a plan view showing the structure of a related art driving circuit-integrated liquid crystal display (LCD) device.
Figure 2:
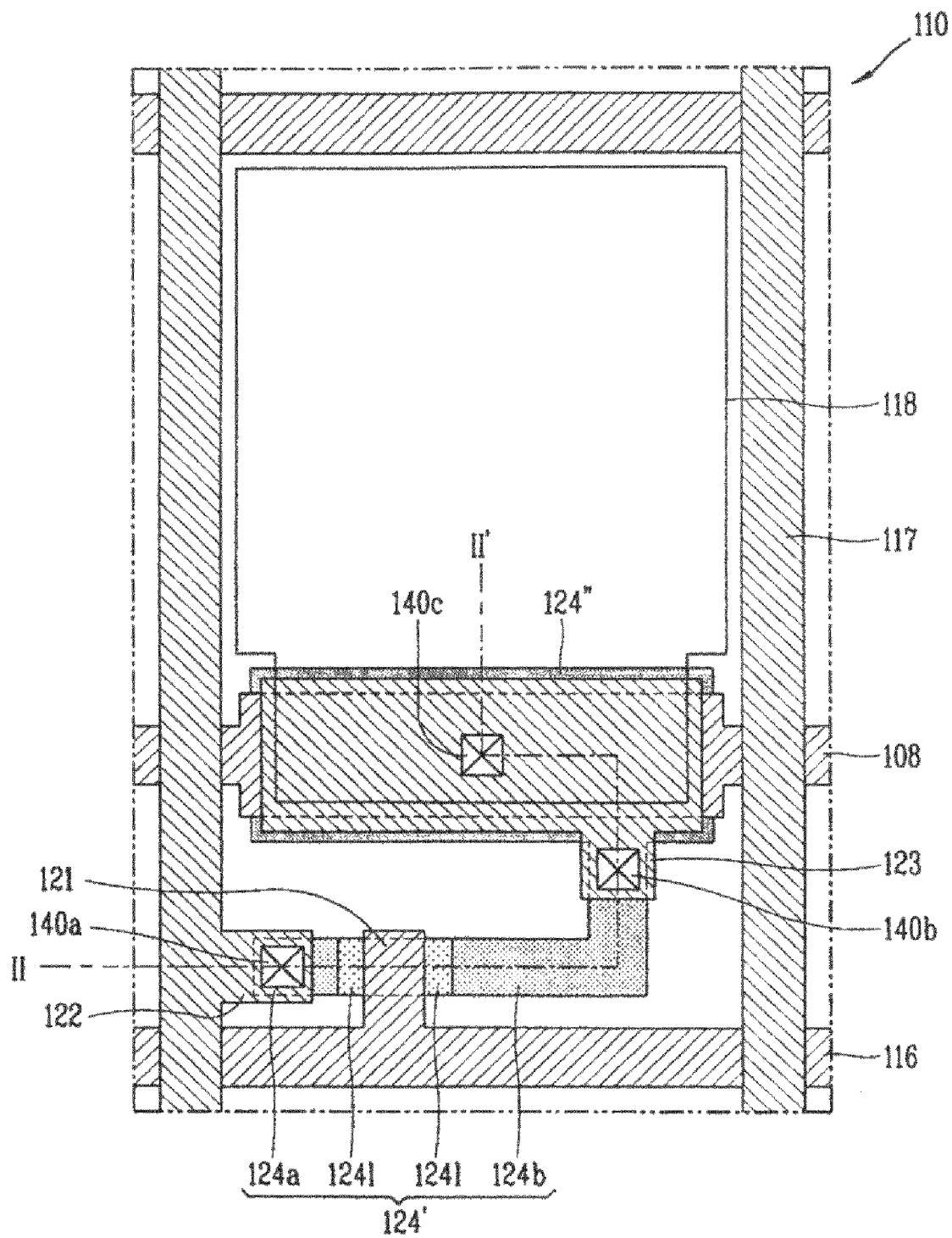
FIG. 2 is a plan view showing a portion of an array substrate of an LCD device according to a first exemplary embodiment of the present invention.

FIG. 2 is a plan view showing a portion of an array substrate of an LCD device according to a first exemplary embodiment of the present invention. Here, one pixel including a thin film transistor (TFT) of a pixel portion is shown. The actual LCD includes M×N pixels defined by N gate lines and M data lines crossing each other. Only one pixel is shown on the drawing for the sake of brevity.

As shown, gate lines 116 and data lines 117 are formed vertically and horizontally to define pixel regions on an array substrate 110. Thin film transistors (TFTs) as switching elements are formed at each crossing of the gate lines 116 and the data lines 117, and pixel electrodes 118 connected to respective TFTs and driving liquid crystal (not shown) together with a common electrode of a color filter substrate (not shown) is formed within the pixel region.

The TFT of FIG. 2 includes a gate electrode 121 connected with the gate line 116, a source electrode 122 connected with the data line 117, and a drain electrode 123 connected with the pixel electrode 118. In addition, the TFT also includes an active pattern 124' for forming a conductive channel between the source electrode 122 and the drain electrode 123 by a gate voltage supplied to the gate electrode 121.

In the first exemplary embodiment of the present invention, the active pattern 124' is formed of a polycrystalline silicon thin film and extends toward the pixel region to be connected with a storage pattern 124" that forms a first storage capacitor together with a common line 108. Namely, the common line 108 is formed in a substantially same direction as that of the gate line 116 in the pixel region and overlaps the storage pattern 124" with a first insulation film (not shown) interposed therebetween to form the first storage capacitor. In this case, the storage pattern 124" is formed by performing storage doping on the polycrystalline silicon thin film by a masking process.

The source electrode 122 and the drain electrode 123 are electrically connected to the source region and the drain region of the active pattern 124' through first and second contact holes 140a and 140b formed at the first and second insulation films (not shown). In addition, the source electrode 122 extends in one direction to form a portion of the data line 117, and the drain electrode 123 extends toward the pixel electrode to be electrically connected to the pixel electrode 118 through a third contact hole 140c formed at a third insulation film (not shown). In this case, the portion of the drain electrode 123 extending toward the pixel electrode overlaps the common line 108 with the second insulation film interposed therebetween to form a second storage capacitor.

An exemplary fabrication process of the array substrate as described above will now be explained in detail with reference to the accompanying drawings.

FIGS. 3A to 3I are sectional views taken along line II-II' of the array substrate of FIG. 2 sequentially showing exemplary fabrication processes, especially showing an example of a process for fabricating the array substrate of the pixel portion on which the TFTs of an n-channel are formed. In this case, both n-channel TFTs and p-channel TFTs are formed on the circuit portion.

Figure 3A:
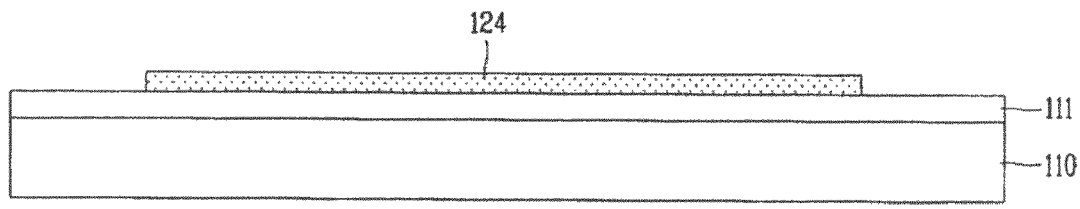
FIGS. 3A to 3I are sectional views taken along line II-II' of the array substrate of FIG. 2 sequentially showing exemplary fabrication processes.

As shown in FIG. 3A, a buffer layer 111 and a silicon thin film are formed on a substrate 110 made of a transparent insulation material, such as glass, and the silicon thin film is crystallized to form a polycrystalline silicon thin film. Thereafter, the polycrystalline silicon thin film is patterned using a photolithography process (a first making process) to form a polycrystalline silicon thin film pattern 124 for forming the active pattern and the storage pattern.

Figure 3B:
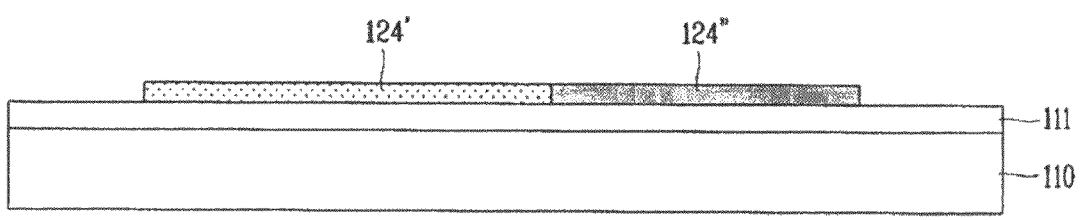

Then, as shown in FIG. 3B, a portion of the polycrystalline silicon thin film 124 is covered, on which doping is performed to form the storage pattern 124". Herein, the portion of the polycrystalline silicon thin film pattern 124 covered by photoresist forms the active pattern 124', and in this case, the photolithography process (a second making process) is additionally performed.

Figure 3C:
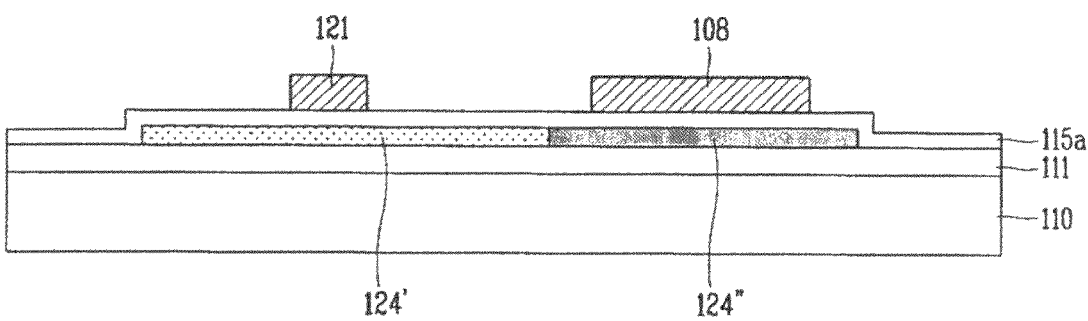

Next, as shown in FIG. 3C, a first insulation film 115a and a first conductive film are sequentially formed on the entire surface of the substrate 110, and the first conductive film is selectively patterned using the photolithography process (a third masking process) to form the gate electrode 121 formed of the first conductive film on the active pattern 124' and simultaneously form the common line 108 formed of the first conductive film on the storage pattern 124". The first conductive film can be made of a low-resistance opaque conductive material, such as aluminum (Al), an aluminum alloy, tungsten, copper, chromium, or molybdenum (Mo). The common line 108 overlaps the storage pattern 124" with the first insulating layer 115a interposed therebetween in the pixel region to form the first storage capacitor.

Figure 3D:
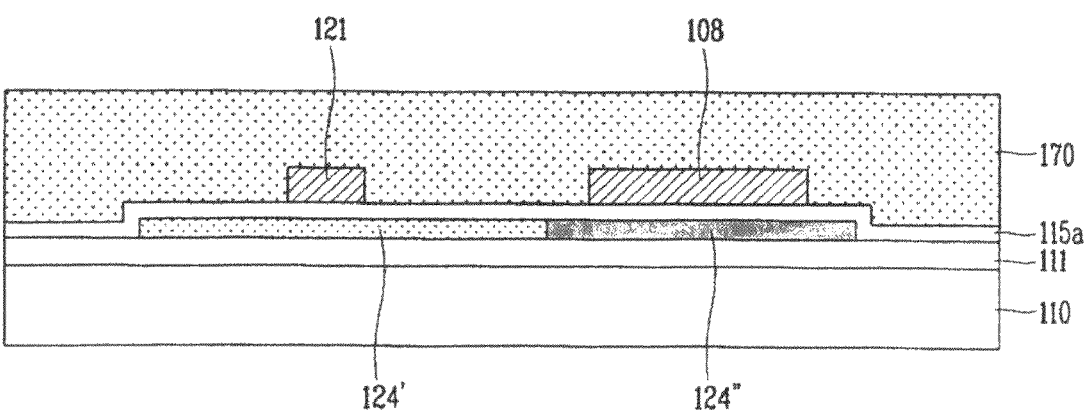

Thereafter, as shown in FIG. 3D, the front side of the pixel portion array substrate 110 and the n-channel TFT region of the circuit portion are covered with a first blocking film 170 (a fourth masking process), the p+ ions with high density are injected (implanted) to the p-channel TFT region of the circuit portion to form the p+ source region and the p+ drain region.

Figure 3E:
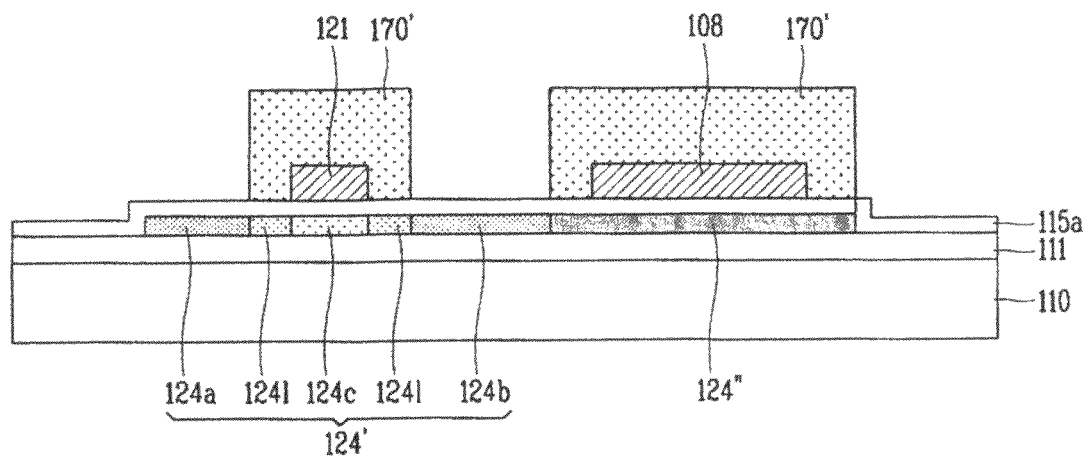

Then, as shown in FIG. 3E, the p-channel TFT region of the circuit portion, a portion of the n-channel TFT region of the pixel portion/circuit portion and the storage region are covered by the second blocking film 170' (a fifth masking process), high density n+ ions are injected to a certain region of the active pattern 124' of the pixel portion to form the n+ source region 124a and n+ drain region 124b. A channel region 124c forms a conductive channel between the source region 124a and the drain region 124b. Thereafter, the second blocking film 170' is removed and low density n- ions are injected on the entire surface of the substrate 110 to form an LDD (Lightly Doped Drain) region 124l between the n+ source region 124a and the channel region 124c and between the n+ drain region 124b and the n+ channel region 124c. In this case, the storage region can be covered by the second blocking film 170' or not, and n+ ions are injected to the n-channel TFT region of the circuit portion in the same manner to form the n+ source region, n+ drain region and an LDD region.

Figure 3F:
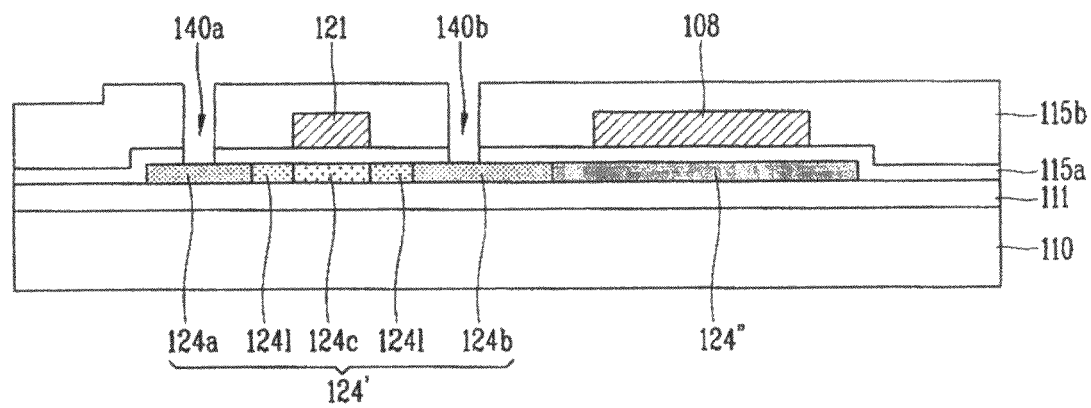

As shown in FIG. 3F, a second insulation film 115b is deposited on the entire surface of the substrate 110, and a portion of the first insulation film 115a and a portion of the second insulation film 115b are removed through a photolithography process (a sixth masking process) to form a first contact hole 140a exposing a portion of the source region 124a and a second contact hole 140b exposing a portion of the drain region 124b.

Figure 3G:
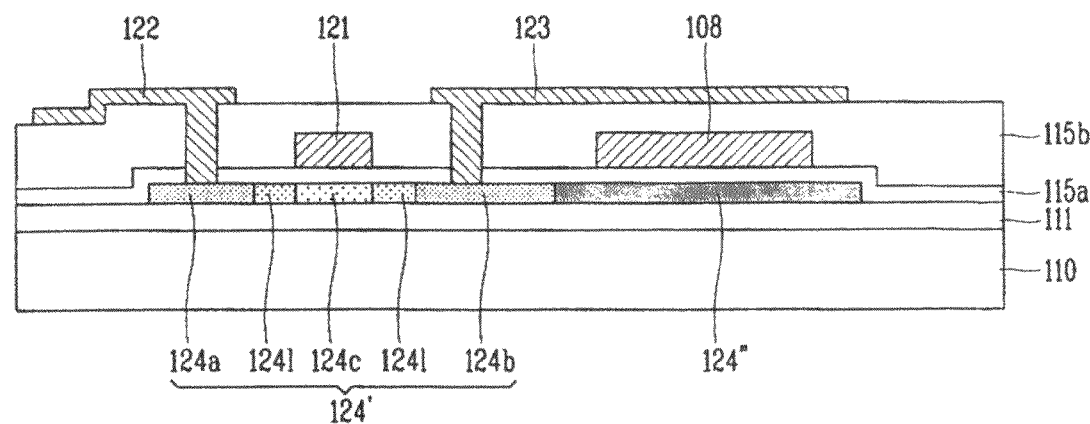

As shown in FIG. 3G, the second conductive film is formed on the entire surface of the substrate 110 and then patterned by using the photolithography process (a seventh masking process) to form a source electrode 122 electrically connected with the source region 124a through the first contact hole 140a and a drain electrode 123 electrically connected with the drain region 124b through the source region 124a through the second contact hole 140b. At this time, a portion of the source electrode 122 extends to the pixel region to overlap the common line 108 with the second insulation film 115b interposed therebetween to form a second storage capacitor.

Figure 3H:
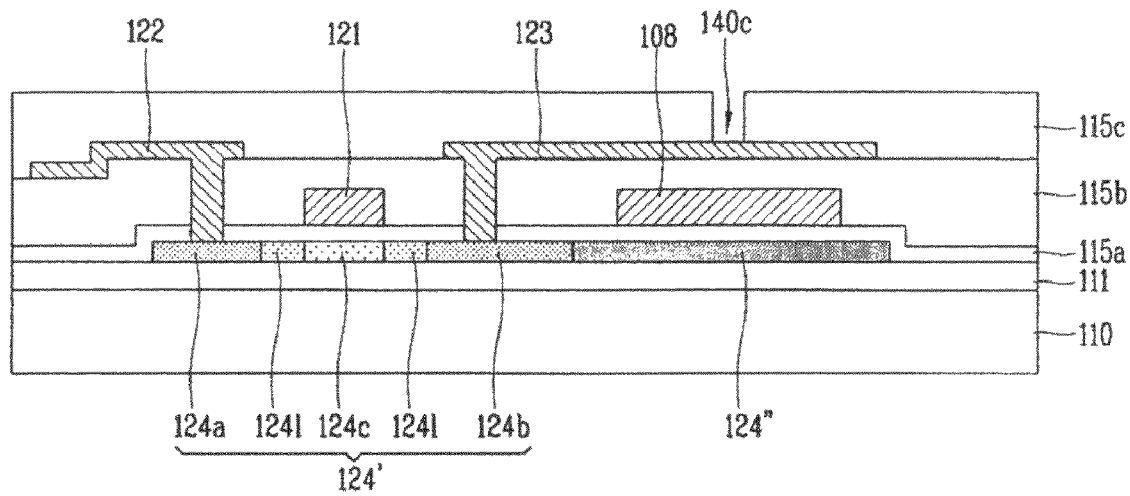

Subsequently, as shown in FIG. 3H, a third insulation film 115c is deposited on the entire surface of the substrate 110 and then patterned using the photolithography process (an eighth masking process) to form a third contact hole 140c exposing a portion of the drain electrode 123.

Figure 3I:
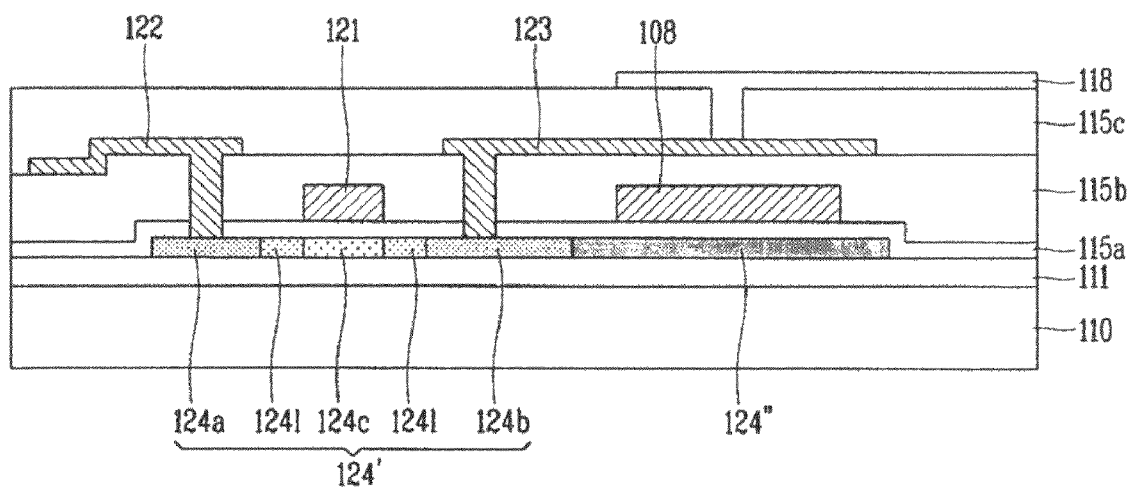

Then, as shown in FIG. 3I, a third conductive film is formed on the entire surface of the substrate 110 with the third insulation film 115c formed thereon to form a pixel electrode 118 electrically connected with the drain electrode 123 through the third contact hole 140c. The third conductive film can be made of a transparent conductive material, such as indium tin oxide (ITO) or indium zinc oxide (IZO), to form the pixel electrode 118.

In the first embodiment of the present invention, the active pattern and the storage pattern are formed of the polycrystalline silicon thin film and storage doping is performed on the storage pattern through separate masking processes: Namely, the TFTs of the pixel portion and the circuit portion are fabricated through a total of nine masking processes. Comparatively, in the second embodiment of the present invention, the active pattern formed of a silicon thin film and a storage electrode made of a conductive material can be formed through a single masking process using a slit exposure (or diffraction exposure).

Figure 4:
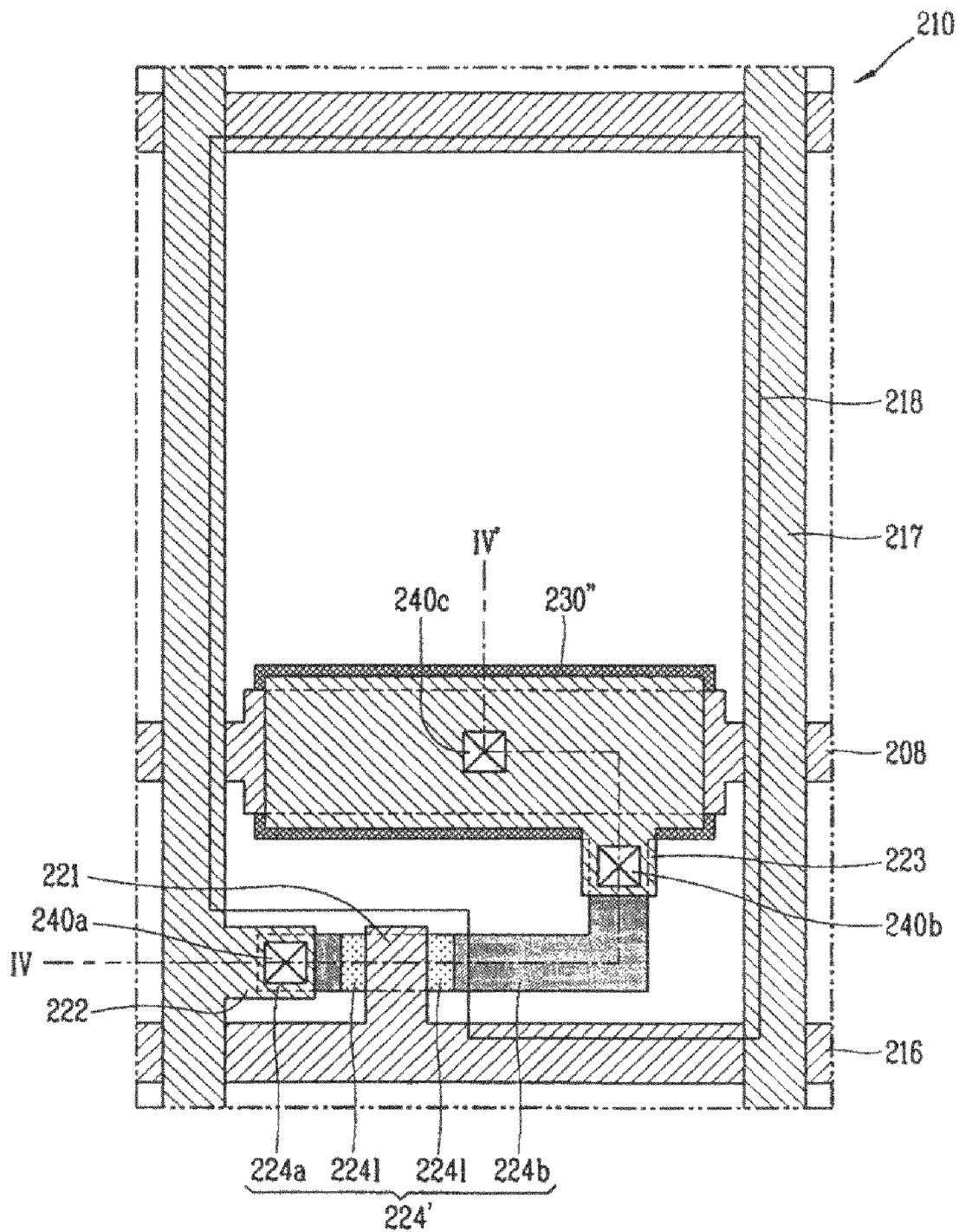
FIG. 4 is a plan view showing a portion of an array substrate of an LCD device according to a second exemplary embodiment of the present invention.

FIG. 4 is a plan view showing a portion of an array substrate of an LCD device according to a second exemplary embodiment of the present invention. Again, only a single pixel including a TFT of a pixel portion is shown. The actual LCD includes M×N pixels defined by N gate lines and M data lines crossing each other, and one pixel is shown on the drawing for the sake of brevity.

As shown, in the second embodiment of the present invention, gate lines 216 and data lines 217 are formed vertically and horizontally to define pixel regions on an array substrate 210. Thin film transistors (TFTs) as switching elements are formed at each crossing of the gate lines 216 and the data lines 217, and pixel electrodes 218 connected to respective TFTs and driving liquid crystal (not shown) together with a common electrode of a color filter substrate (not shown) is formed within the pixel region.

The TFT of FIG. 4 includes a gate electrode 221 connected with the gate line 216, a source electrode 222 connected with the data line, and a drain electrode 223 connected with the pixel electrode 218. In addition, the TFT also includes an active pattern 224' for forming a conductive channel between the source electrode 222 and the drain electrode 223 by a gate voltage supplied to the gate electrode 221.

A portion of the active pattern 224' formed of a polycrystalline silicon thin film extends to the pixel region, and a storage electrode 230" made of a conductive material is formed at an upper portion of active pattern 224' extended to the pixel region with a first gate insulation film (not shown) interposed therebetween. In addition, a common line 208 is formed in a substantially same direction as that of the gate line 216 in the pixel region and overlaps the storage electrode 230" with a second gate insulation film (not shown) interposed therebetween to form a first storage capacitor. In this case, unlike the storage pattern in the first embodiment of the present invention, in the second embodiment of the present invention, the storage electrode 230" is made of an opaque conductive material and simultaneously formed with the active pattern 224' through a single masking process.

The source electrode 222 and the drain electrode 223 are electrically connected to the source region and the drain region of the active pattern 224' through first and second contact holes 240a and 240b formed at the first and second gate insulation films and a second gate insulation film (not shown). In addition, the source electrode 222 extends in one direction to form a portion of the data line 217, and a portion of the drain electrode 223 extends toward the pixel electrode to be electrically connected with the pixel electrode 218 through a third contact hole 240c formed at a third insulation film (not shown). In this case, the portion of the drain electrode 223 extending toward the pixel electrode overlaps the common line 208 with the second insulation film interposed therebetween to form a second storage capacitor.

Herein, in the second embodiment of the present invention, the third insulation film is formed of an organic insulation film and allows the pixel electrode 218 to overlap a portion of the gate line 216 and the data line 217, and accordingly, an aperture ratio can be enhanced.

The array substrate in the second embodiment of the present invention can be formed such that a conductive material is deposited on an upper portion of the polycrystalline silicon thin film, and then, the active pattern 224' and the storage electrode 230" can be simultaneously formed through a single masking process using a slit exposure. This will now be described in detail through a method for fabricating an LCD.

FIGS. 5A to 5J are sectional views taken along line IV-IV' of the array substrate of FIG. 4 sequentially showing exemplary fabrication processes, and FIGS. 6A to 6F are plan views taken along line IV-IV' of the array substrate in FIG. 4 and sequentially showing fabrication processes. In general, an n-channel TFT and p-channel TFT can be formed at the pixel portion, and n-channel TFT and p-channel TFT are all formed at the circuit portion to make a CMOS. In the drawing, for the sake of explanation, the method for fabricating the n-channel TFT of the pixel portion and the n-channel TFT and p-channel TFT of the circuit portion is shown as an example.

Figure 5A:
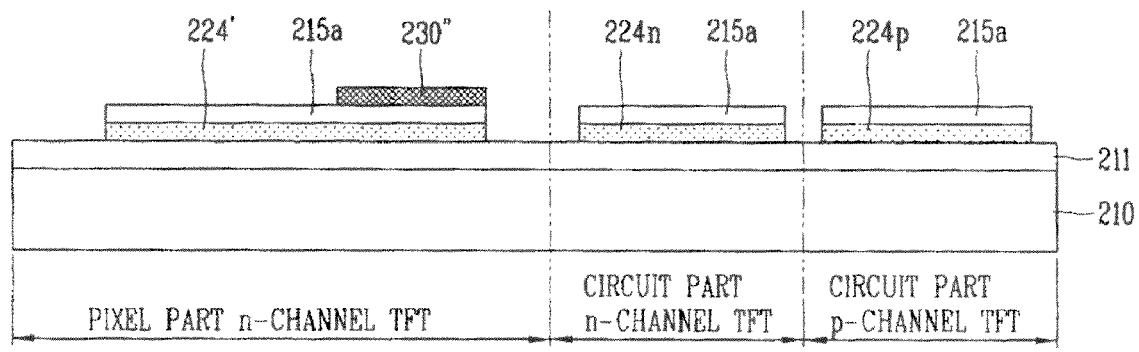
FIGS. 5A to 5J are sectional views taken along line IV-IV' of the array substrate on FIG. 4 sequentially showing exemplary fabrication processes.

As shown in FIG. 5A, a buffer layer 211 and a silicon thin film are formed on the substrate 210 made of a transparent insulation material, such as glass, and the silicon thin film is crystallized to form a polycrystalline silicon thin film. The buffer layer 211 prevents impurities, such as sodium (Na), in the substrate 210 from infiltrating into an upper layer during processing.

Thereafter, a first gate insulation film 215a and a conductive film are formed on the entire surface of the substrate 210 with the polycrystalline silicon thin film is formed thereon, and then patterned using a photolithography process (a first masking process) to form the active pattern 224' and the storage electrode 230" on the array substrate 210 of the pixel portion (FIG. 6A) and an n-channel active pattern 224n and a p-channel active pattern 224p on the array substrate 210 of the circuit portion (FIG. 5A). As mentioned above, the active patterns 224', 224n and 224p and the storage electrode 230" can be formed through a single masking process using a slit exposure, which will now be described in detail with reference to the accompanying drawings.

Figure 6A:
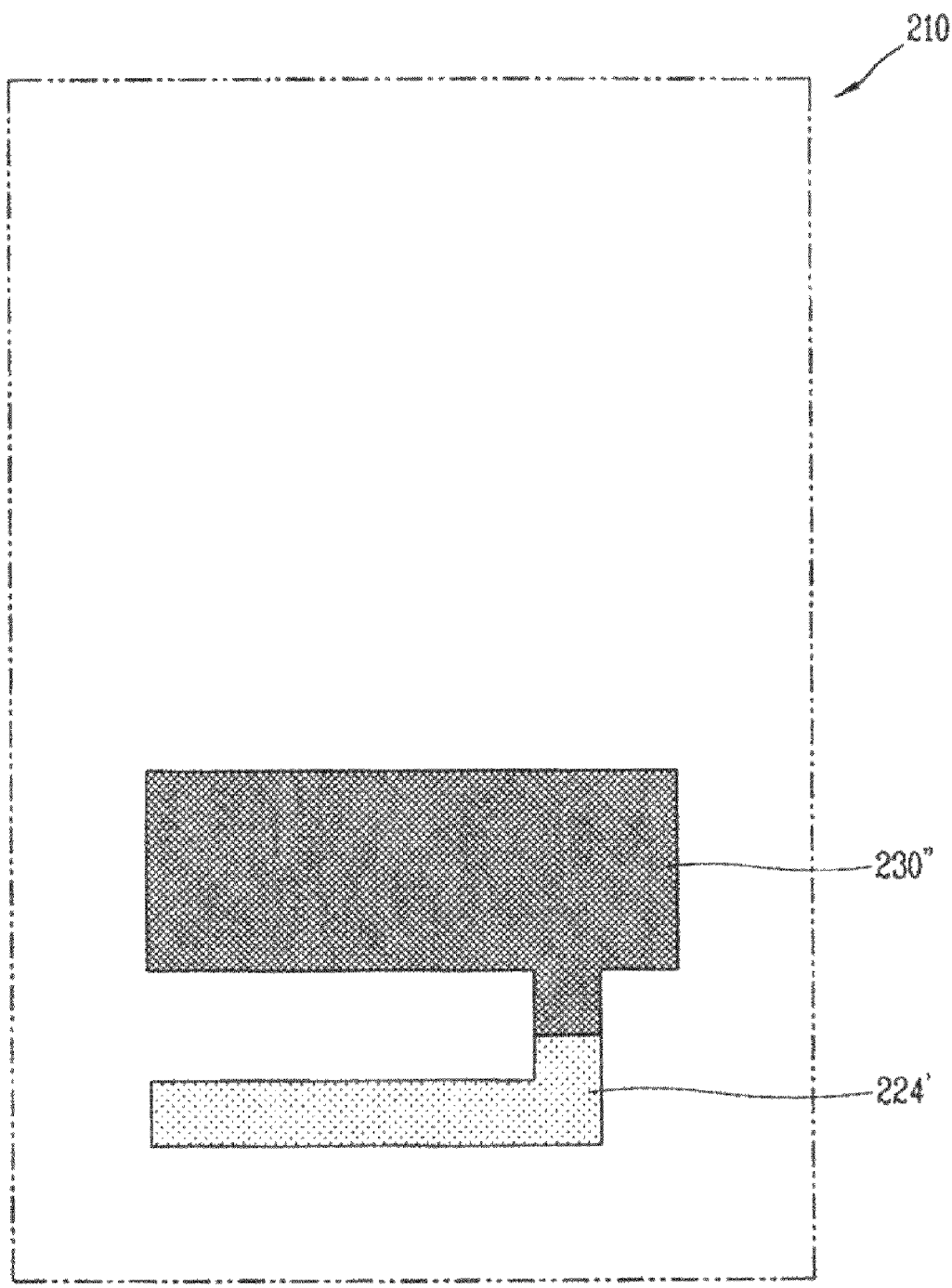
FIGS. 6A to 6F are plan views taken along line IV-IV' of the array substrate of FIG. 4 sequentially showing exemplary fabrication processes.

FIGS. 7A to 7F are sectional views showing a first masking process in FIGS. 5A and 6A.

Figure 7A:
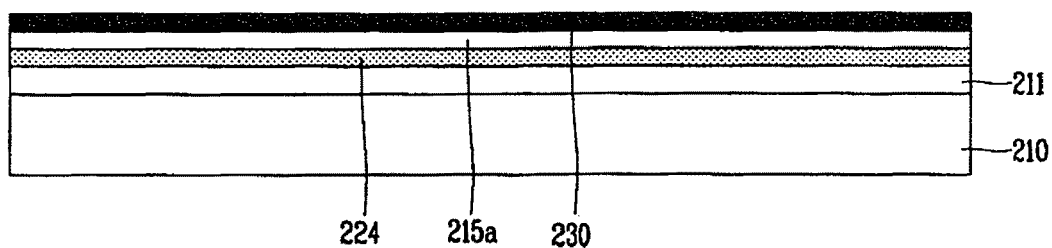
FIGS. 7A to 7F are sectional views showing a first making process in FIGS. 5A and 6A.

As shown in FIG. 7A, the buffer layer 211 and the silicon thin film 224 are formed on the substrate 210 made of the transparent insulation material, such as glass.

The silicon thin film 224 can be formed as an amorphous silicon thin film or a polycrystalline silicon thin film. In this embodiment of the present invention, the TFT is formed using a polycrystalline silicon film. In this case, the polycrystalline silicon thin film can be formed by various crystallizing methods after forming the amorphous silicon thin film on the substrate, as will be described as follows.

First, the amorphous silicon thin film can be deposited through several methods. Typical methods include a low pressure chemical vapor deposition (LPCVD) and a plasma enhanced chemical vapor deposition (PECVD). The methods for crystallizing the amorphous silicon thin film include a solid phase crystallization (SPC) for heat-treating the amorphous silicon thin film at a high temperature in a furnace and an eximer laser annealing (ELA) method using laser. As the laser crystallization, the ELA using laser of the pulse form is commonly used, and recently, a sequential lateral solidification (SLS) which remarkably improves the crystallization characteristics by growing grains in a horizontal direction has been proposed, on which research is widely ongoing.

A first gate insulation film 215a and a conductive film 230 made of a molybdenum- or aluminum-based conductive material are formed on the crystallized polycrystalline silicon thin film 224. In the second embodiment of the present invention, the first gate insulation film 215a is formed on the polycrystalline silicon thin film 224, and then, the conductive film 230 is formed on the first gate insulation film 215a. This differs from forming the conductive film 230 for forming the storage electrode through sputtering directly on the polycrystalline silicon thin film 224, and thus, damage to a surface of the polycrystalline silicon thin film 224 by the sputtering can be prevented.

Figure 7B:
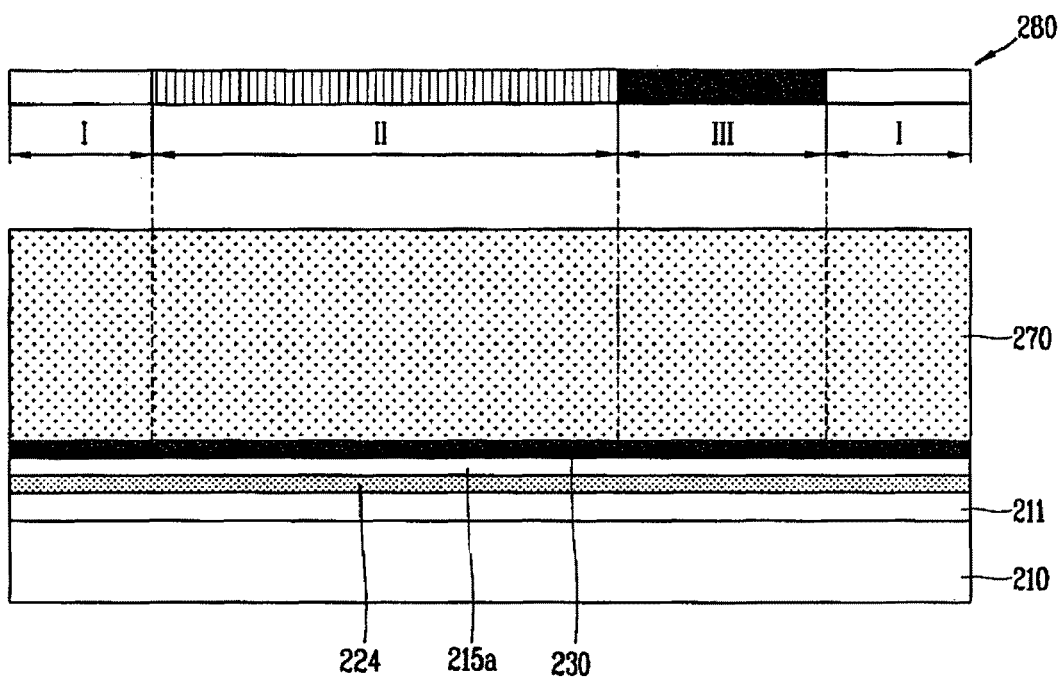

Next, as shown in FIG. 7B, after a photosensitive film 270 made of a photosensitive material, such as photoresist, is formed on the entire surface of the substrate 210, and light is selectively irradiated on the photosensitive film 270 through a slit mask 280 or a half-tone mask. The slit mask 280 includes a transmission region (I) for entirely transmitting irradiated light, a slit region (II) with a slit pattern for transmitting only a portion of light and blocking a portion of light, and a blocking region (III) for entirely blocking irradiated light. Only light which has transmitted through the slit mask 280 can be irradiated on the photosensitive film 270.

Figure 7C:
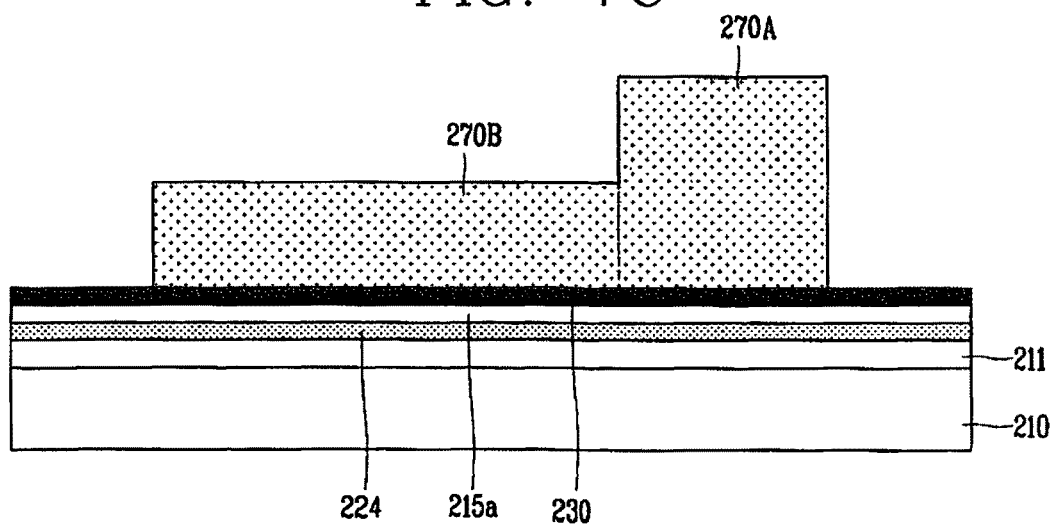

Subsequently, when the photosensitive film 270 which has been exposed through the slit mask 280 is developed, as shown in FIG. 7C, first and second photosensitive film patterns 270A and 270B with a certain thickness remain at regions where light has been entirely blocked or partially blocked through the blocking region (III) and the slit region (II), and the photosensitive film at the transmission region (I) to which light has been entirely transmitted has been completely removed to expose the surface of the conductive film 230.

At this time, the first photosensitive film pattern 270A formed through the blocking region (III) is thicker than the second photosensitive film pattern 270B formed through the slit region (II). Also, the photosensitive film at the region to which light has been entirely transmitted through the transmission region (I) is completely removed, which is because positive photoresist is used. However, the present invention is not limited thereto, and a negative photoresist can be also used.

Figure 7D:
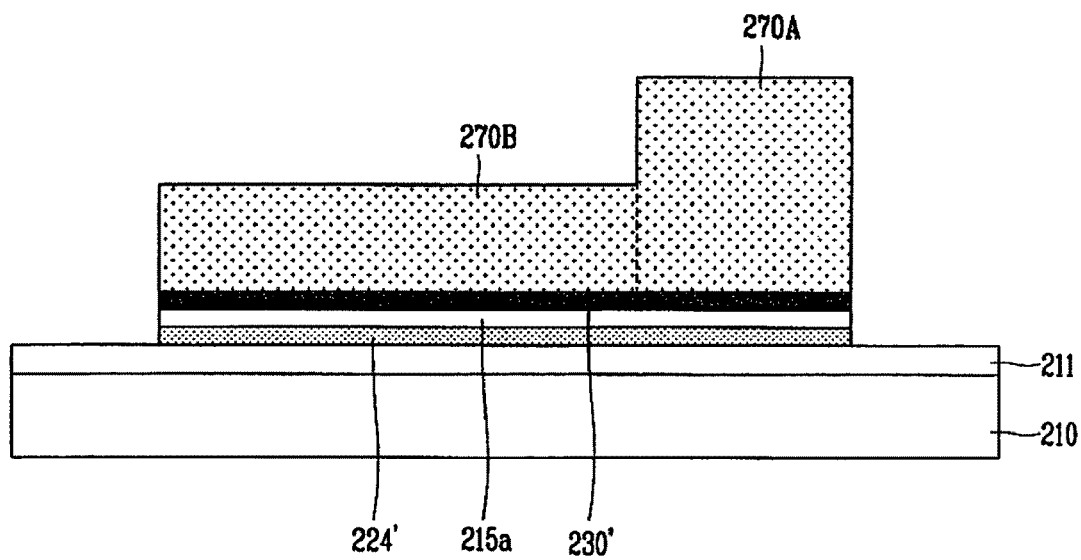
Figure 7E:
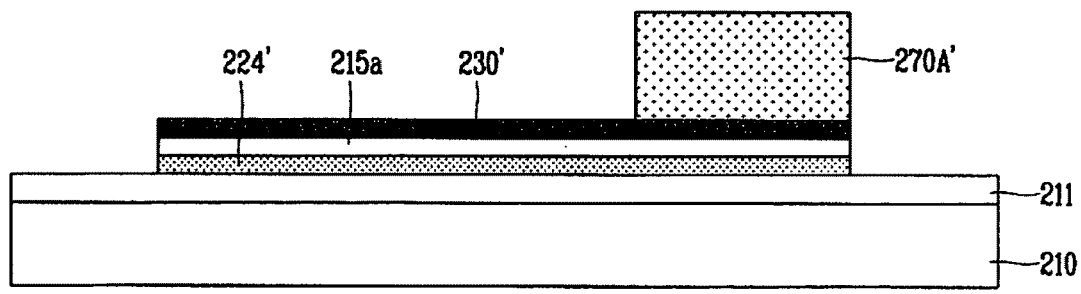

Next, as shown in FIG. 7D, the polycrystalline silicon thin film and the conductive film are selectively removed using the first and second photosensitive film patterns 270A and 270B as masks to form the active pattern 224' formed of the polycrystalline silicon thin film on the substrate 210. In this case, the conductive film pattern 230' formed of the conductive film and patterned in the same shape as the active pattern 224' remains at the upper portion of the active pattern 224'. Thereafter, when an ashing process is performed to remove a portion of the first and second photosensitive film patterns 270A and 270B, as shown in FIG. 7E, the second photosensitive film pattern at the upper portion of the active pattern 224', namely, the second photosensitive film pattern of the slit region (II) where the slit exposure has been applied, is completely removed to expose the surface of the conductive film pattern 230'. In this case, the first photosensitive film pattern remains as a third photosensitive film pattern 270A' with a thickness obtained by removing the thickness of the second photosensitive film pattern on the upper portion of the region corresponding to the blocking region (III).

Figure 7F:
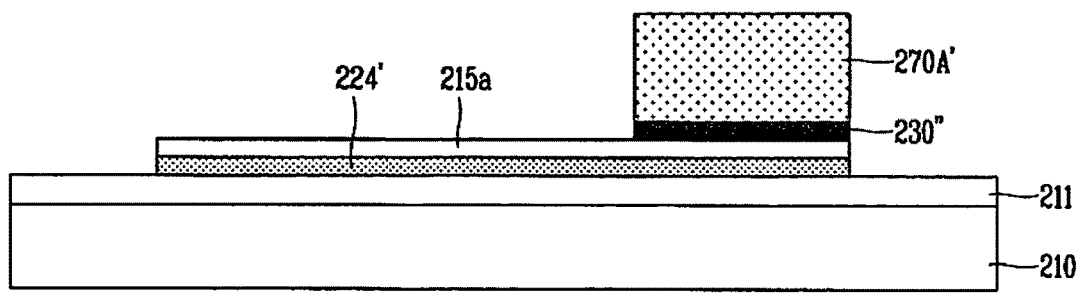

As shown in FIG. 7F, when a portion of the conductive film pattern 230' is removed using the remaining third photosensitive film pattern 270A', a storage electrode 230" formed of a conductive film is formed.

Figure 5B:
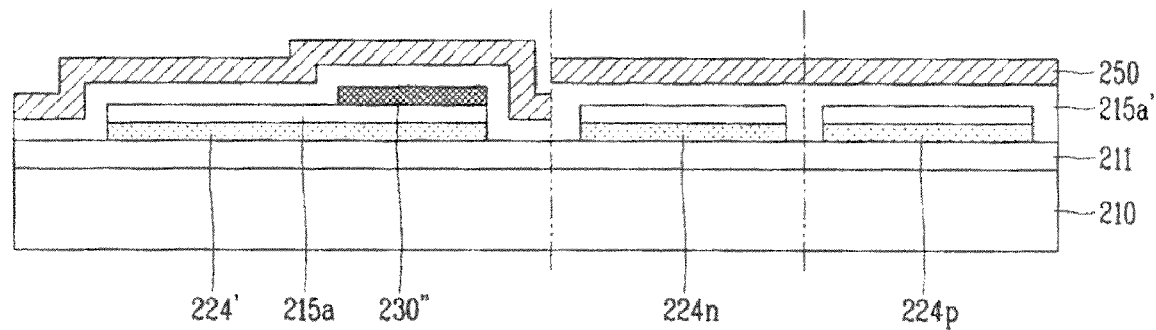

Then, as shown in FIG. 5B, a second gate insulation film 215a' and a first conductive film 250 are formed on the entire surface of the substrate 210. To form a common line with the gate electrode, the first conductive film 250 can be made of a low resistance opaque conductive material, such as aluminum (Al), an aluminum alloy, tungsten (W), copper (Cu), chromium (Cr), molybdenum (Mo), etc.

Figure 5C:
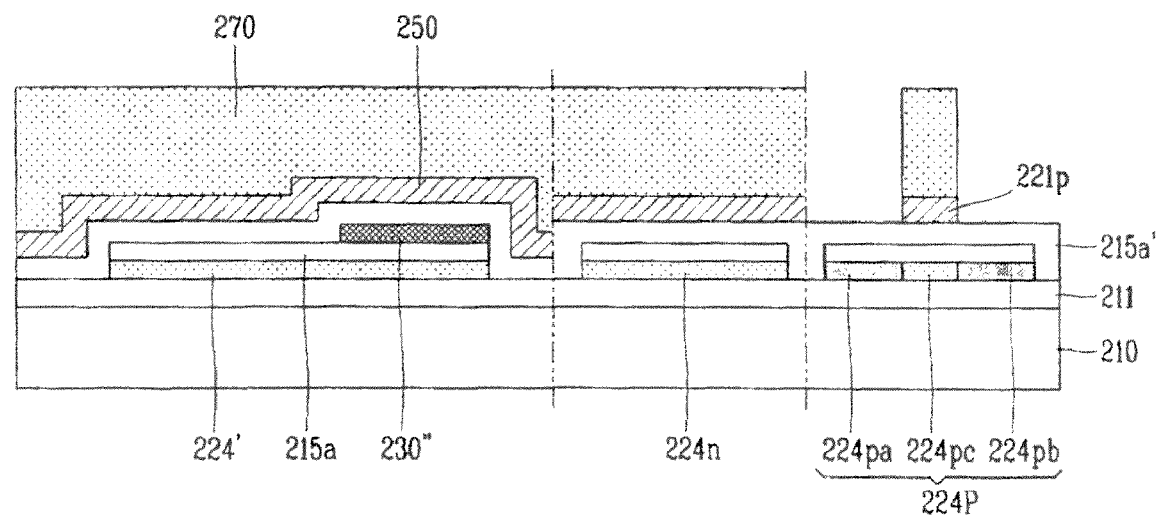

As shown in FIG. 5C, after the entire n-channel TFT region of the pixel portion and the circuit portion and a certain region of the p-channel TFT region of the circuit portion are covered by a first blocking film 270 made of photoresist (a second masking process), the first conductive film is selectively patterned using the first blocking film 270 as a mask to form a circuit portion gate electrode 221p formed of the first conductive film at the p-channel TFT region of the circuit portion.

Then, high density p+ ions are injected to the p-channel TFT region of the circuit portion using the first blocking film 270 as a mask to form a p+ source region 224pa and p+ drain region 224pb. Herein, a p-channel region 224pc forms a conductive channel between the p+ source region 224pa and p+ drain region 224pb.

Figure 5D:
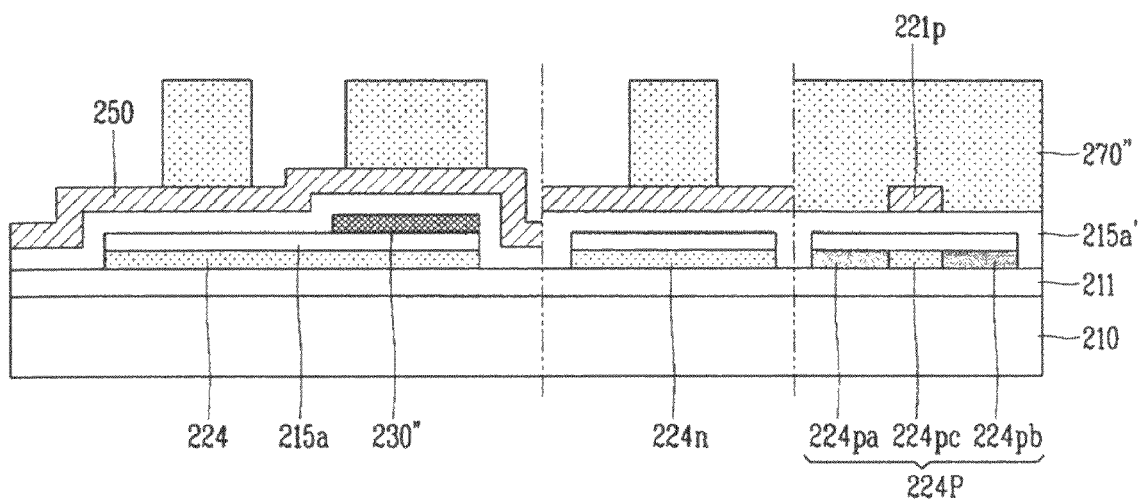
Figure 5E:
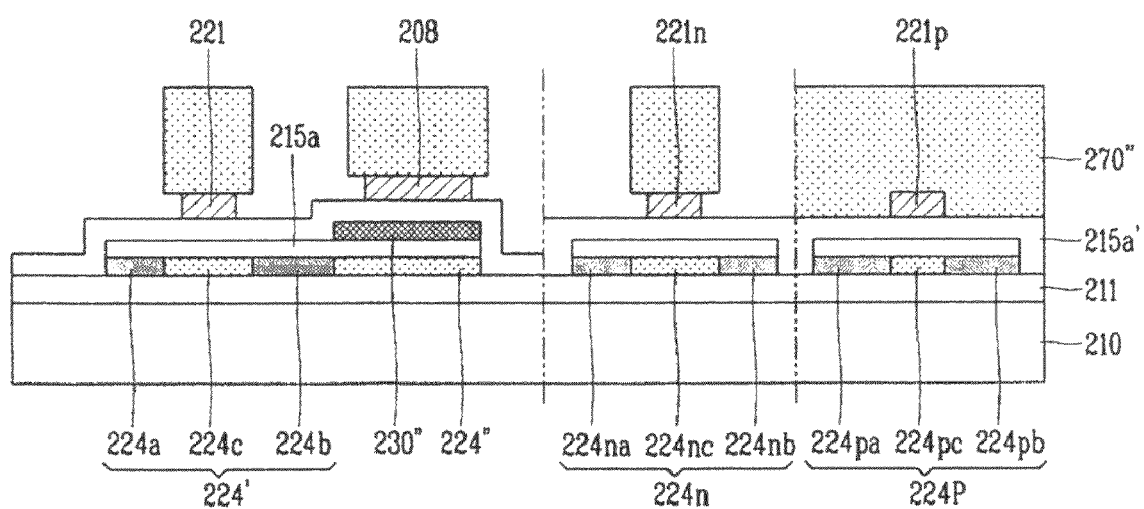
Figure 6B:
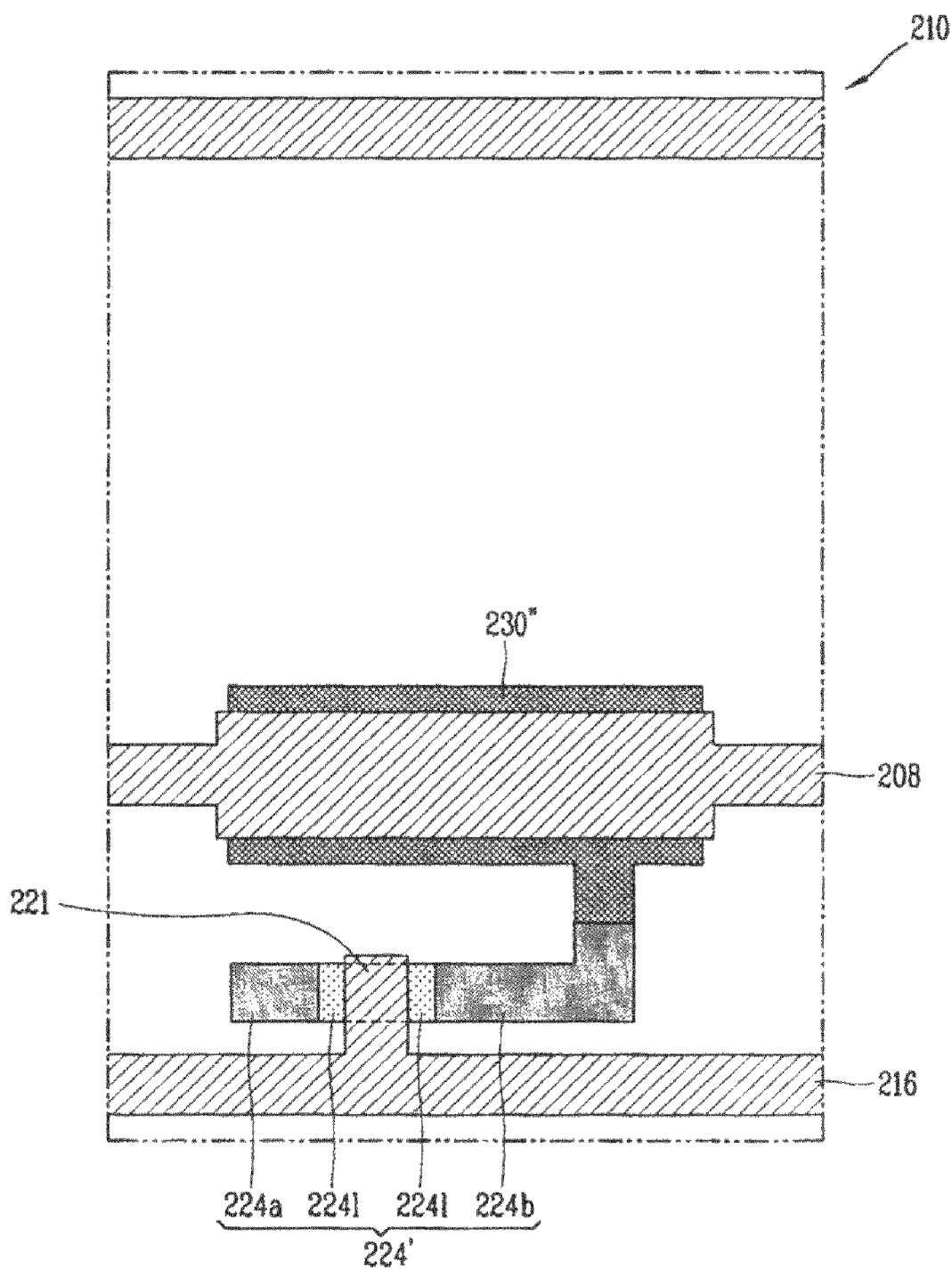

Thereafter, as shown in FIGS. 5D, 5E and 6B, after the entire p-channel TFT region of the circuit portion, and a portion of the n-channel TFT region of the pixel portion and the circuit portion are covered by a second blocking film 270" (a third masking process), the first conductive film is patterned using the second blocking film 270" as a mask to form a pixel portion gate electrode 221 and circuit portion gate electrodes 221n and 221p and a common line 208 at an upper portion of the storage electrode 230". In this case, a width of the gate electrodes 221, 221n and 221p and the storage electrode 230" is reduced to be smaller than that of the upper second blocking film 270" by over-etching the first conductive film through wet etching.

Herein, the common line 208 of the pixel portion overlaps the storage electrode 230" with the second gate insulation film 215a' interposed therebetween, thereby forming a first storage capacitor. In this case, in the second embodiment of the present invention, because the gate insulation film includes the first and second gate insulation films 215a and 215a, the second gate insulation film 215' can be formed thin so that the capacity of the first storage capacitor can be large. Accordingly, the area of the opaque storage region, such as the storage electrode 230" or the common line 208 can be reduced, and thus, an aperture ratio can be substantially increased.

Thereafter, the high density n+ ions are injected to the n-channel TFT region of the pixel portion and the circuit portion using the second blocking film 270" as a mask to form n+ source regions 224a and 224na and n+ drain regions 224b and 224nb. Herein, n-channel regions 224c and 224nc form conductive channels between the n+ source regions 224a and 224na and the respective n+ drain regions 224b and 224nb.

Figure 5F:
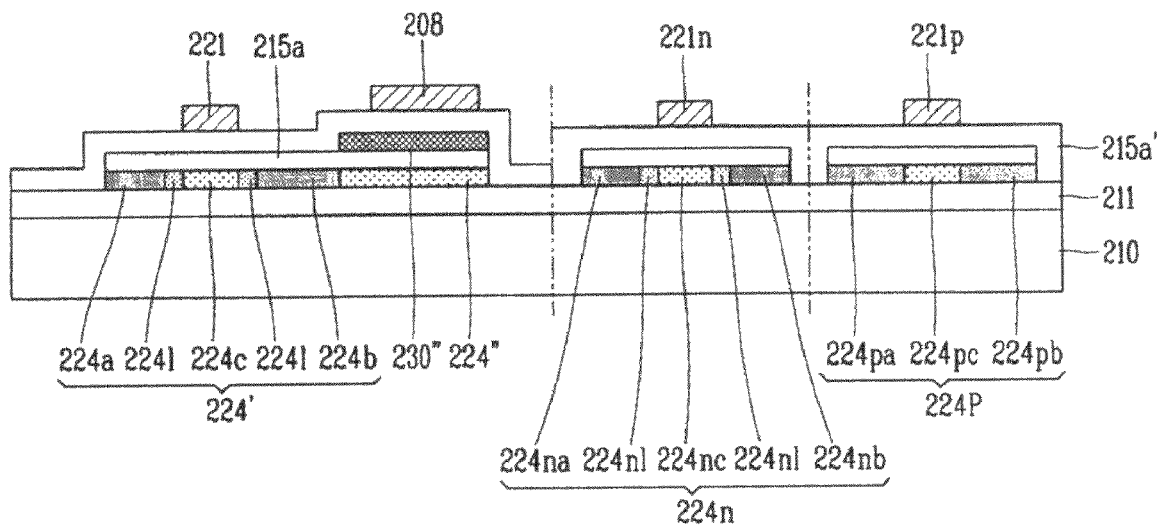

As shown in FIG. 5F, after the second blocking film is removed, low density n− ions are injected to the entire surface of the substrate 210 to form LDD regions 224l and 224l between the n+ source regions 224a and 224na and the channel regions 224c and 224nc and between the n+ drain regions 224b and 224nb and the channel regions 224c and 224nc.

Figure 5G:
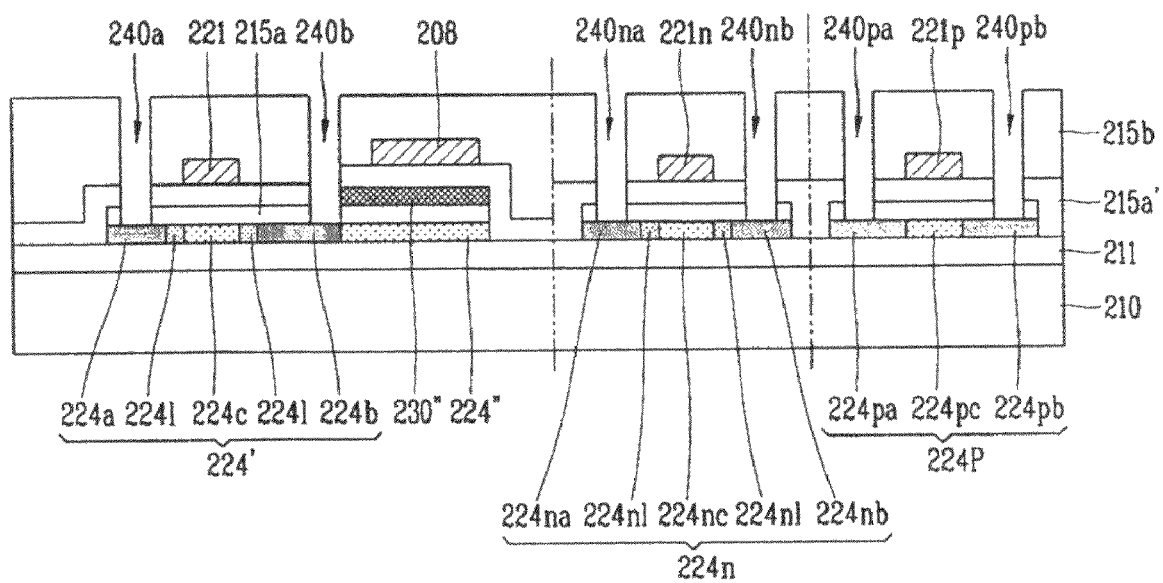
Figure 6C:
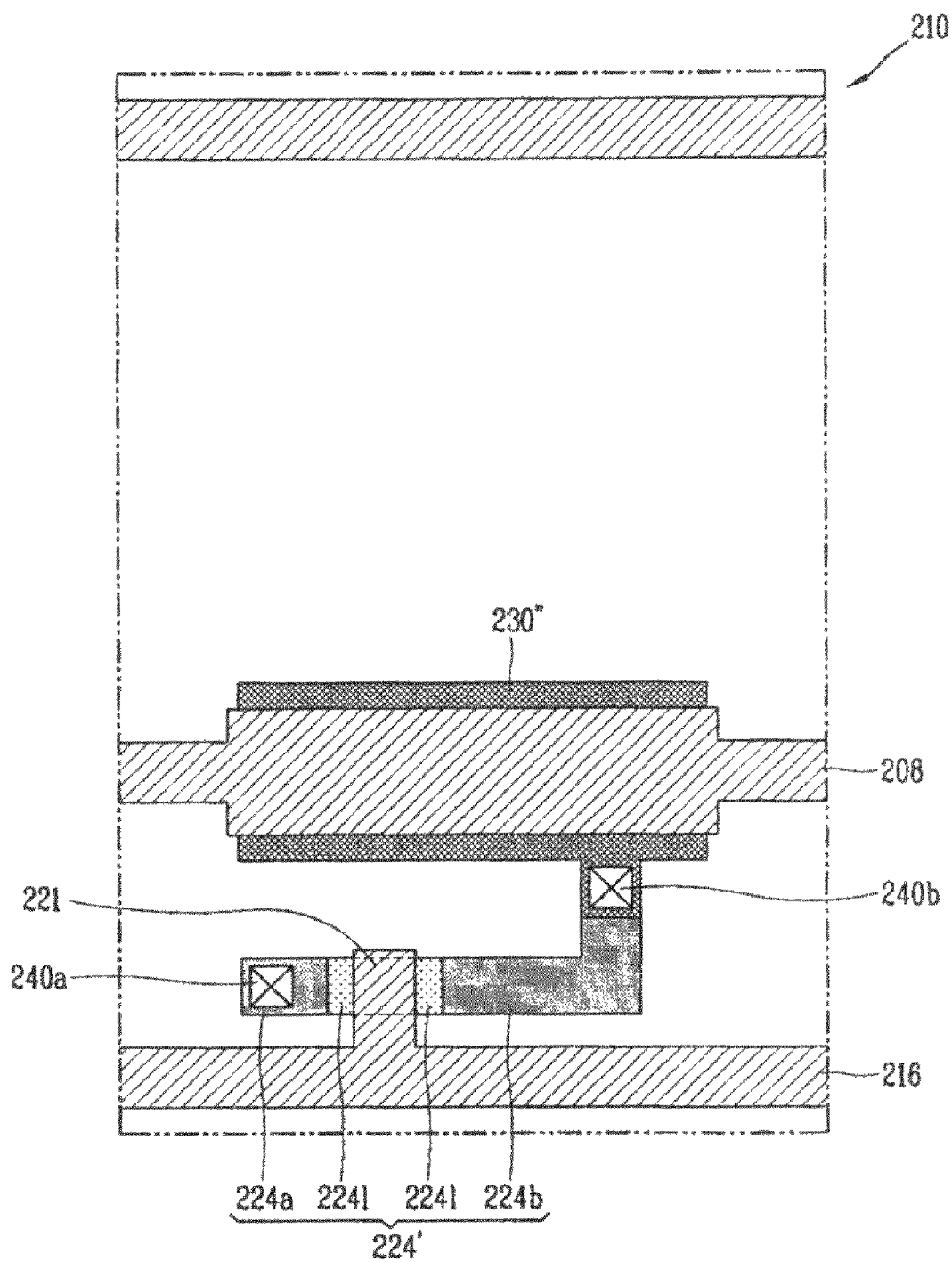

Next, as shown in FIGS. 5G and 6C, after the second insulation film 215b is deposited on the entire surface of the substrate 210, portions of the first gate insulation film 215a, the second gate insulation film 215a' and the second insulation film 215b are removed through a photolithography process (a fourth masking process) to form first contact holes 240a, 240na and 240pa exposing portions of the source regions 224a, 224na and 224pa and second contact holes 240b, 240nb and 240pb exposing portions of the drain regions 224b, 224nb and 224pb.

Herein, as the second insulation film 215b, a dual-layer of $SiN_x$ and $SiO_2$ can be used. In this case, after $SiO_2$ is deposited, it can be activated and thermally treated, and after $SiN_x$ is deposited, it can be hydrogenated and activated. Alternatively, both $SiN_x$ and $SiO_2$ are deposited, they can be simultaneously hydrogenated and activated through a single heat treatment. In addition, as the second insulation film 215b, a $SiN_x$ single layer or a triple layer of $SiO_2/SiN_x/SiO_2$ can be used.

When the second contact hole 240b of the pixel portion is formed, portions of the drain region 224b of the pixel portion and the storage electrode 230" can be exposed together. Or, after two second contact holes are formed such that a portion of the drain region 224b of the pixel portion and a portion of the storage electrode 230" can be separately exposed, and then connected by the drain electrode.

Figure 5H:
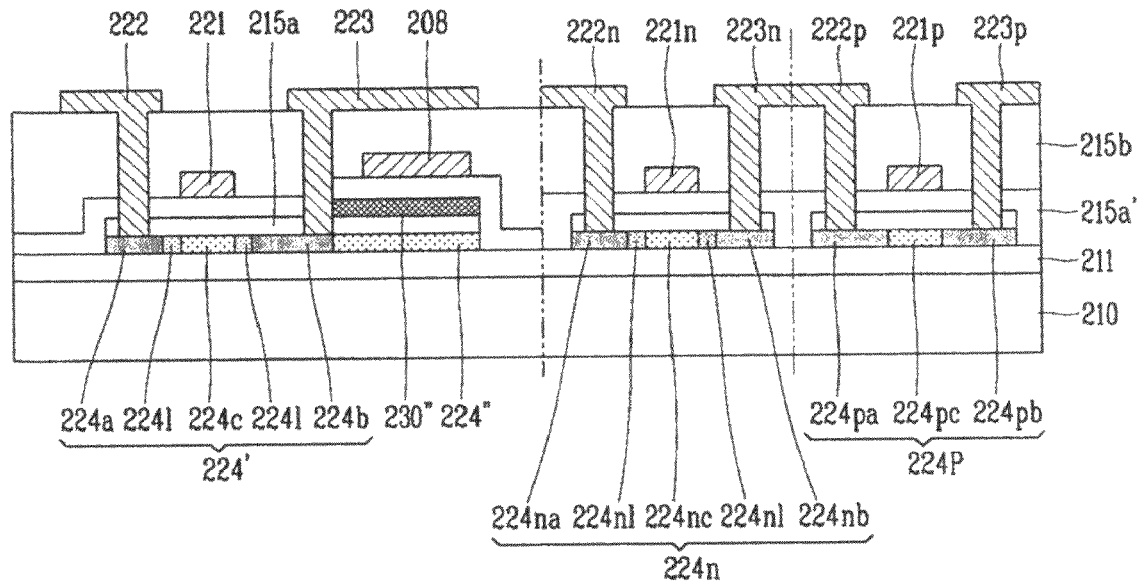
Figure 6D:
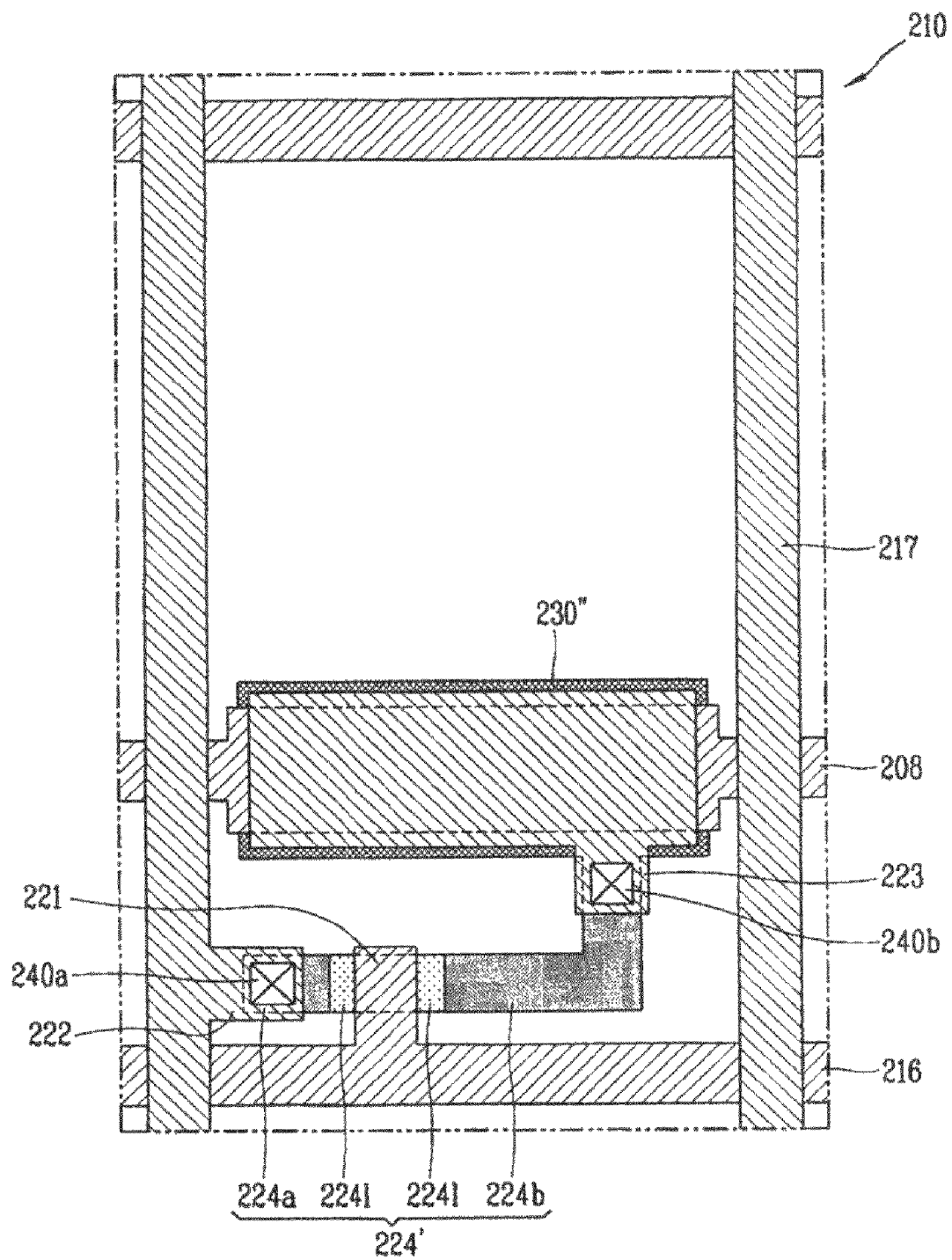

Thereafter, as shown in FIGS. 5H and 6D, a second conductive film is formed on the entire surface of the substrate 210 and patterned using a photolithography process (a fifth masking process) to form source electrodes 222, 222n and 222p electrically connected to the source regions 224a, 224na and 224pa through the first contact holes 240a, 240na and 240pa and drain electrodes 223, 223n and 223p electrically connected to the drain regions 224b, 224nb and 224pb through the second contact holes 240b, 240nb and 240pb. In this case, a portion of the source electrode 222 of the pixel portion extends in one direction to form the data line 217, and a portion of the drain electrode 223 of the pixel portion extends to the pixel region to overlap the common line 208 with the second insulation film 215b interposed therebetween to form the second storage capacitor.

Figure 5I:
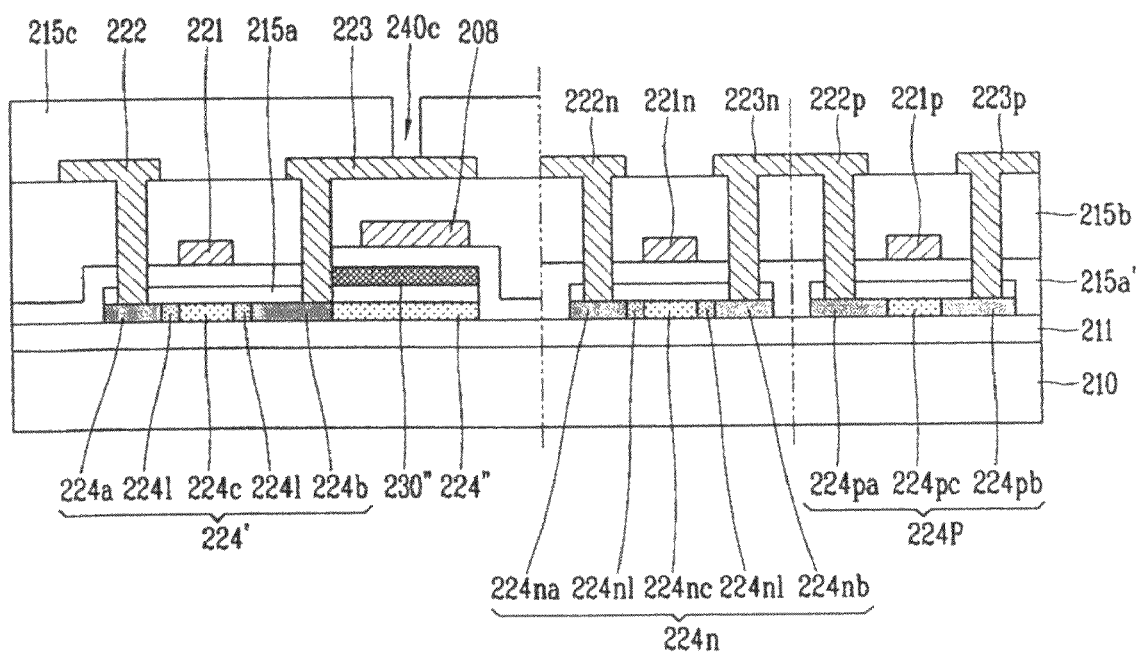
Figure 6E:
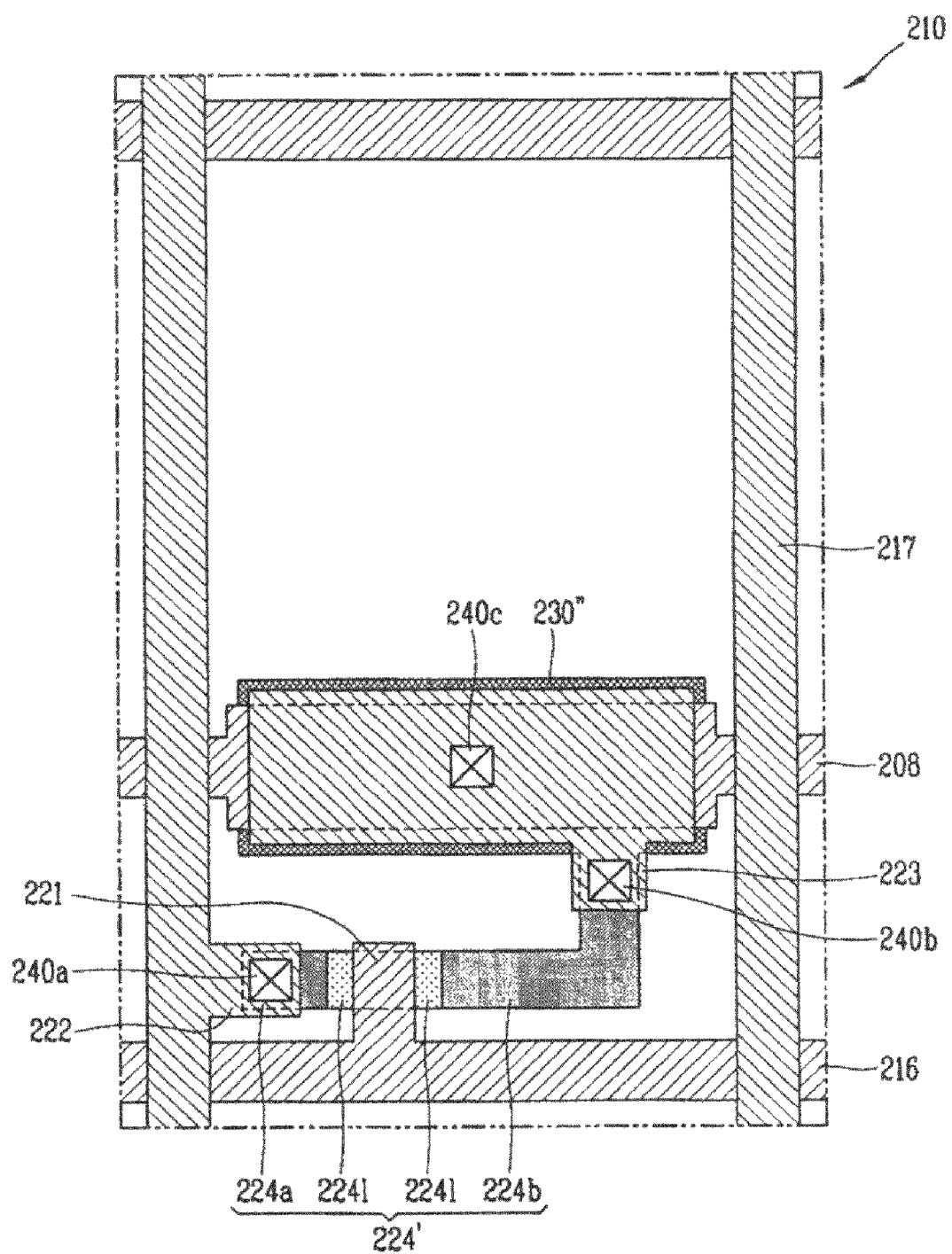

Next, as shown in FIGS. 5I and 6E, a third insulation film 215c is deposited on the entire surface of the substrate 210 and patterned using the photolithography process (a sixth masking process) to form a third contact hole 240c exposing a portion of the drain electrode 223 of the pixel portion. In this case, the third insulation film 215c can be made of a transparent organic material, such as benzocyclobutene or acrylic resin, for a high aperture ratio.

Figure 5J:
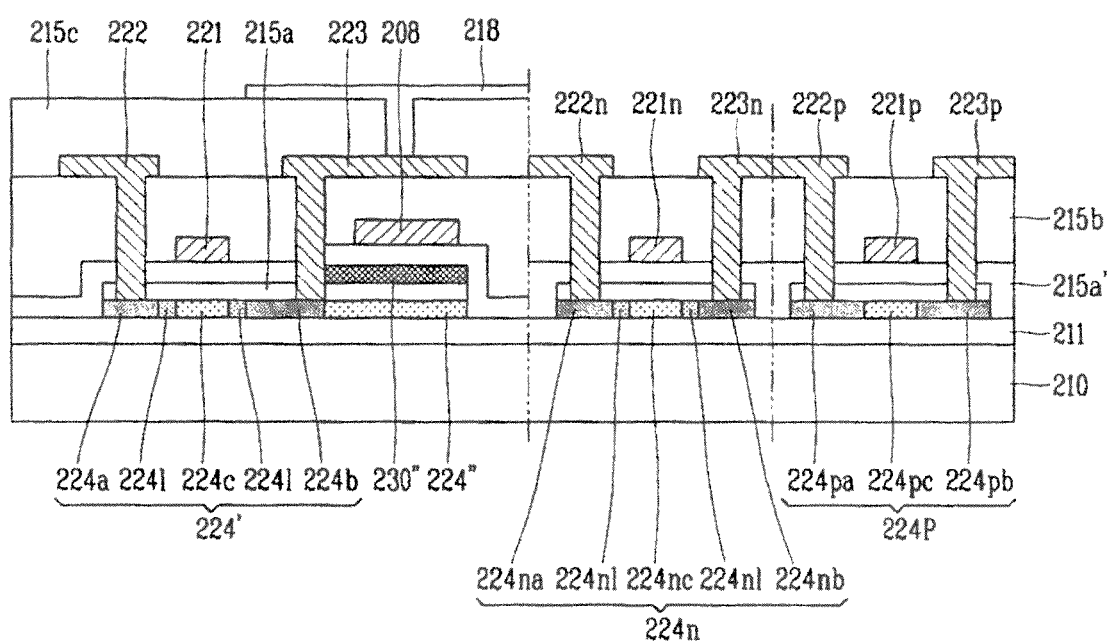
Figure 6F:
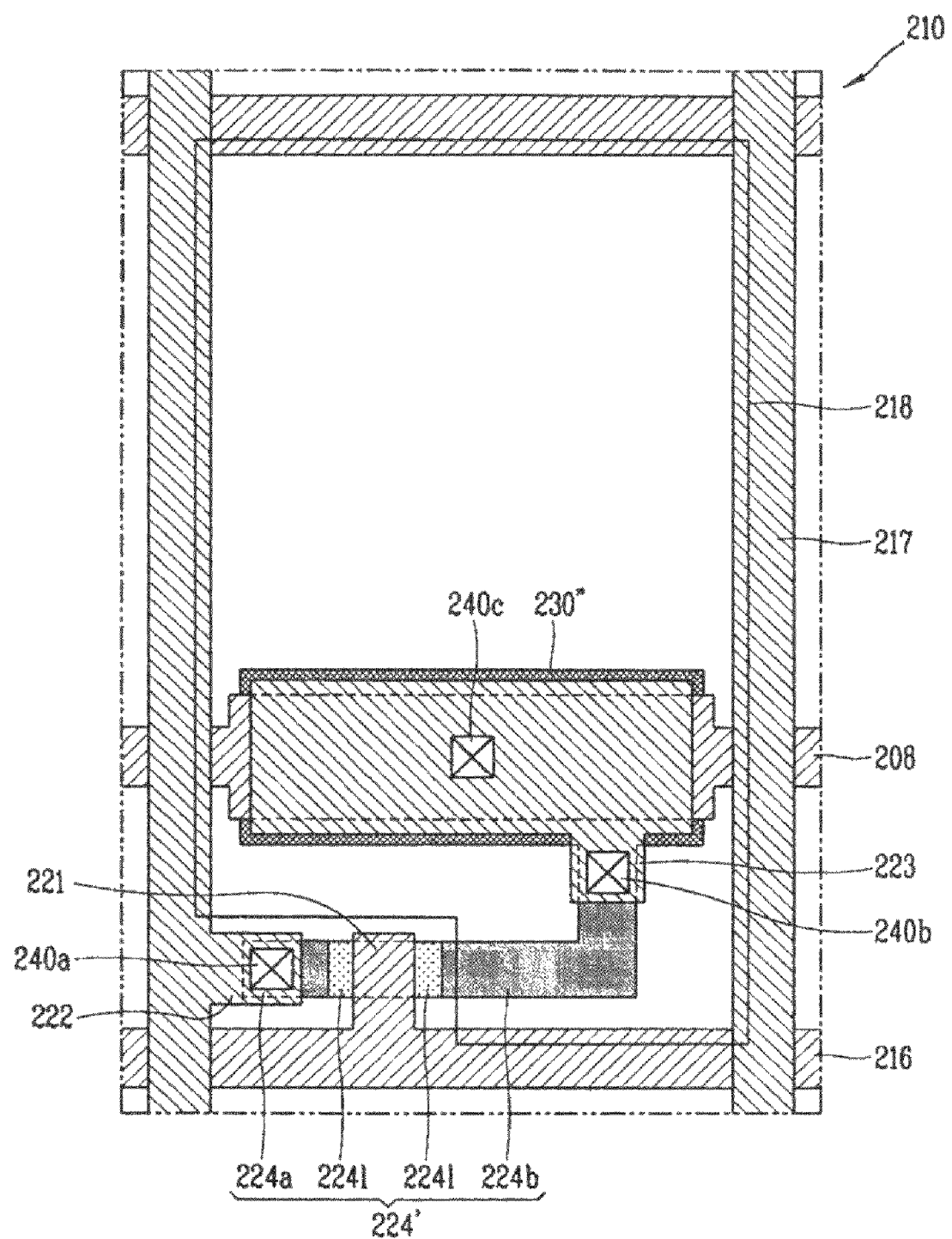

Then, as shown in FIGS. 5J and 6F, a third conductive film is formed on the entire surface of the substrate 210 with the third insulation film 215c formed thereon and selectively patterned using a photolithography process (a seventh masking process) to form a pixel electrode 218 electrically connected with the drain electrode 223 of the pixel portion through the third contact hole 240c. The third conductive film can be made of a transparent conductive material with good transmittance, such as ITO or IZO, to form the pixel electrode 218.

In the second embodiment of the present invention, because the third insulation film 215c is made of the organic material, the pixel electrode 218 can overlap a portion of the data line 217 and the gate line 216 so that the aperture ratio can be substantially improved.

The array substrates in the first and second embodiments of the present invention are attached facing each other by a sealant formed on an outer edge of the image display region thereby forming a liquid crystal display device. The attachment of the array substrate and the color filter substrate is made through an attachment key formed on the array substrate and the color filter substrate.

It will be apparent to those skilled in the art that various modifications and variations can be made in the liquid crystal display device and fabrication method thereof of the present invention without departing from the spirit or scope of the invention. Thus, it is intended that the present invention cover the modifications and variations of this invention provided they come within the scope of the appended claims and their equivalents.

What is claimed is:

1. A liquid crystal display device (LCD), comprising:
   a first substrate including a pixel portion and a circuit portion, the circuit portion having first and second regions;
   a pixel portion active pattern formed at the pixel portion, first and second active patterns formed respectively at the first and second regions;
   a first gate insulation film formed on the pixel portion active pattern and the first and second active patterns;
   a storage electrode formed on a portion of the pixel portion active pattern;
   a second gate insulation film formed on the first substrate;
   a common line formed at the pixel portion, wherein the common line overlaps with the storage electrode with the second gate insulation film interposed therebetween to form a first storage capacitor
   a pixel portion gate electrode formed at the pixel portion and first and second gate electrodes formed respectively at the first and second regions;
   a second insulation film formed on the first substrate, wherein the second insulation film covers the pixel portion gate electrode and first and second gate electrodes;
   a pixel portion source electrode electrically connected to the pixel portion active pattern, and first and second source electrodes electrically connected to the first and second active patterns, respectively;
   a pixel portion drain electrode electrically connected to the pixel portion active pattern, and first and second drain electrodes electrically connected to the first and second active patterns, respectively;
   a third insulation film formed on the first substrate,
   wherein the third insulation film covers the pixel portion source electrode and a portion of the pixel portion drain electrode and
   wherein the third insulation film is made of an organic material; and
   a second substrate attached to the first substrate.

2. The device of claim 1, wherein high density p+ impurity ions are injected into the first source and drain regions.

3. The device of claim 1, wherein high density n+ impurity ions are injected into the pixel portion source and drain regions and the second source and drain regions.

4. The device of claim 1, wherein the pixel portion source electrode, the first source electrode and the second source electrode are electrically connected to the pixel portion active pattern, the first active pattern and the second active pattern through the first contact holes formed at the first region of the first gate insulation film, the second gate insulation film and the second insulation film.

5. The device of claim 1, wherein the pixel portion drain electrode, the first drain electrode and the second drain electrode are electrically connected to the pixel portion active pattern, the first active pattern and the second active pattern through the second contact holes formed at the second regions of the first gate insulation film, the second gate insulation film and the second insulation film.

6. The device of claim 5, wherein the second contact hole of the pixel portion simultaneously exposes a portion of the storage electrode and a portion of the drain electrode.

7. The device of claim 1, wherein the active pattern is formed of a polycrystalline silicon thin film.

8. The device of claim 1, wherein the storage electrode is formed of a conductive material.

9. The device of claim 1, wherein the pixel portion drain electrode is electrically connected to the pixel electrode through the third contact hole formed at the third region of the third insulation film.

10. The device of claim 1, wherein the common line overlaps a portion of the upper pixel portion drain electrode with the second insulation film interposed therebetween to form a second storage capacitor.

11. The device of claim 1, wherein the second insulation film is formed of a silicon nitride film.

12. The device of claim 1, wherein the second insulation film is formed of two or more layers including at least a silicon nitride film.

13. The device of claim 1, wherein the organic material includes one of benzocyclobutene and acrylic resin.

* * * * *